United States Patent
So et al.

(10) Patent No.: US 7,198,878 B2
(45) Date of Patent: Apr. 3, 2007

(54) AQUEOUS DEVELOPABLE, PHOTOSENSITIVE BENZOCYCLOBUTENE-BASED OLIGOMERS AND POLYMERS WITH HIGH MOISTURE RESISTANCE

(75) Inventors: Ying Hung So, Midland, MI (US); Scott J. Bis, Midland, MI (US); Keith J. Watson, Midland, MI (US)

(73) Assignee: The Dow Chemical Company, Midland, MI (US)

( * ) Notice: Subject to any disclaimer, the term of this patent is extended or adjusted under 35 U.S.C. 154(b) by 0 days.

(21) Appl. No.: 11/146,818

(22) Filed: Jun. 7, 2005

(65) Prior Publication Data

US 2005/0228147 A1    Oct. 13, 2005

Related U.S. Application Data

(62) Division of application No. 10/273,540, filed on Oct. 18, 2002, now Pat. No. 7,019,093.

(51) Int. Cl.
*G03F 7/023*  (2006.01)
*G03F 7/30*   (2006.01)

(52) U.S. Cl. ............ 430/190; 430/326; 430/330
(58) Field of Classification Search ............ 430/190, 430/326, 330
See application file for complete search history.

(56) References Cited

U.S. PATENT DOCUMENTS

| | | | |
|---|---|---|---|
| 4,540,763 A | 9/1985 | Kirchhoff | |
| 4,724,260 A | 2/1988 | Kirchhoff et al. | |
| 4,783,514 A | 11/1988 | Kirchhoff et al. | |
| 4,812,588 A | 3/1989 | Schrock | |
| 4,822,930 A | 4/1989 | Liu | |
| 4,826,997 A | 5/1989 | Kirchhoff | |
| 4,999,499 A | 3/1991 | Bhatt | |
| 5,136,069 A | 8/1992 | DeVries et al. | |
| 5,138,081 A | 8/1992 | DeVries et al. | |
| 5,185,391 A | 2/1993 | Stokich, Jr. | |
| 5,227,536 A | 7/1993 | Thomas et al. | |
| 5,243,068 A | 9/1993 | DeVries et al. | |
| 5,349,111 A | 9/1994 | Scheck | |
| 5,422,221 A * | 6/1995 | Okazaki et al. | 430/190 |
| 5,854,302 A | 12/1998 | Foster et al. | |
| 6,210,855 B1 * | 4/2001 | Ueda et al. | 430/190 |
| 6,361,926 B1 | 3/2002 | So et al. | |
| 6,538,087 B2 | 3/2003 | Zhao et al. | |
| 6,677,099 B1 | 1/2004 | Ishii et al. | |
| 7,019,093 B2 * | 3/2006 | So et al. | 526/280 |
| 2004/0005506 A1 | 1/2004 | Nishimura et al. | |

FOREIGN PATENT DOCUMENTS

| | | |
|---|---|---|
| EP | 0 527 508 | 2/1993 |
| WO | WO-93/12055 | 6/1993 |
| WO | WO-94/25903 | 11/1994 |

OTHER PUBLICATIONS

Kirchhoff, et al. "Benzocyclobutenes in Polymer Synthesis", *Prog. Polym. Sci*, vol. 18, pp. 85-185, 1993.
Reiser, *Photoreactive Polymers, The Science and Technology of Resists*, Chapter 5, pp. 178-225, 1989.
So et al., "Benzocyclobutene-based Polymers for Microelectronics", *Chemical Innovation*, vol. 31, No. 12, pp. 40-47, 2001.

* cited by examiner

*Primary Examiner*—John S. Chu

(57) ABSTRACT

The invention is a photoswitchable benzocyclobutene-based polymer that while remaining aqueous developable, avoids the problem of significant moisture uptake. The oligomer or polymer comprises a polymeric backbone, benzocyclobutene reactive groups, and photoswitchable pendant groups. The pendant groups are bonded to the polymeric backbone and are characterized by the presence of a moiety that converts to carboxylic acid upon exposure to activating wavelengths of radiation a carboxylic acid. When the oligomer or polymer is subsequently heated to cause cure of the oligomer or polymer, carbon dioxide is emitted and the group forms a substantially non-polar moiety. The invention is also a method of making such a polymer and a method of forming a patterned film using such a polymer.

8 Claims, No Drawings

AQUEOUS DEVELOPABLE, PHOTOSENSITIVE BENZOCYCLOBUTENE-BASED OLIGOMERS AND POLYMERS WITH HIGH MOISTURE RESISTANCE

CROSS-REFERENCE TO RELATED APPLICATION

This application is a divisional of application Ser. No. 10/273,540 filed Oct. 18, 2002 now U.S. Pat. No. 7,019,093.

FIELD OF THE INVENTION

This invention relates to aqueous developable photosensitive benzocyclobutene based resins and their use in microelectronics manufacture.

BACKGROUND OF THE INVENTION

In manufacture of various microelectronic devices electrically insulating materials are applied to isolate and protect various electrically conducting and semiconducting components. Frequently, it is desirable to form a pattern or image from the electrically insulating materials, thereby defining conductive pathways in the electrically insulating materials.

Depending upon the application, various materials have been used as the electrically insulating materials. The pattern or image may be formed in a variety of manners depending upon the type of insulating material selected.

Thermosetting polymers and oligomers made from benzocyclobutene containing monomers (also referred to as cyclobutarenes) are known to be useful as electrically insulating materials in electronic devices. Commercial examples of such materials based on the 1,3-bis(2-bicyclo[4.2.0]octa 1,3,5-trien-3-yl ethenyl)-1,1,3,3 tetramethylsiloxane (referred to herein as DVS-bisBCB) monomer are available from The Dow Chemical Company under the tradename CYCLOTENE™. Typically, these materials are applied to a substrate by standard coating techniques (e.g. spin coating). They are cured or cross-linked by heating, and they are patterned by etching. Recognition of the desirability of having resins which do not require additional coating steps used in standard lithographic etching has led to the development of CYCLOTENE 4000 resins, which are negative tone photosensitive compositions, in which the portion of the material which is not exposed to the activating radiation is removed by solvent during development. After patterning, the remaining resin is cured.

U.S. Pat. No. 6,361,926 taught that benzocyclobutene based oligomers and polymers could be made soluble in such alkaline aqueous solutions by the inclusion of acid functionality in the oligomer. This patent taught that photosensitive compositions could be made by mixing the benzocyclobutene oligomer formulation with a photoinitiator (to provide negative tone systems) or dissolution inhibitor/photoactive agent (to provide positive tone systems).

SUMMARY OF THE INVENTION

The inventors have found that presence of unused, unremoved, or unneutralized acid functionality, however, can also lead to moisture uptake in the final oligomer or polymer films. Such moisture may be detrimental to the performance of electronic devices containing such polymers. Thus, an improved system is desired.

The inventors have created an improved photosensitive benzocyclobutene-based polymer that while remaining aqueous developable, avoids the problem of significant moisture uptake.

Thus, according to a first embodiment this invention is a thermally curable (i.e. cross-linkable or thermosetting) oligomer or polymer which comprises a polymeric backbone, benzocyclobutene reactive groups, and photoswitchable pendant groups. The pendant groups are bonded to the polymeric backbone and are characterized by the presence of a moiety that converts to carboxylic acid upon exposure to activating wavelengths of radiation to a carboxylic acid. When the oligomer or polymer is subsequently heated to cause cure of the oligomer or polymer, carbon dioxide is emitted and the group forms a substantially non-polar moiety. By polymeric backbone it is meant a chain of two or more, preferably 3 or more, more preferably 4 or more, and most preferably 5 or more monomeric units linked in sequence.

According to a second embodiment, this invention is also a preferred method of making such an oligomer or polymer comprising the steps of forming a reaction mixture comprising a first monomer which includes at least one benzocyclobutene group with a second monomer comprising a hydroxyl group and an aromatic group;

exposing the reaction mixture to conditions to form an oligomer or low molecular weight polymer having hydroxyl pendant groups; and coupling a photoswitchable group precursor to the oligomer or low molecular weight polymer having hydroxyl pendant groups by reaction of the precursor and the hydroxyl groups to form an oligomer or polymer having benzocyclobutene groups and pendant photoswitchable groups.

According to a third embodiment, this invention is a method of forming a patterned film comprising:
  (a) forming a layer of such oligomer or polymer having a photoswitchable pendant group on a substrate;
  (b) exposing the layer to activating radiation in an imagewise manner;
  (c) removing the exposed portions of the layer by washing with an alkaline aqueous solution to form a remaining patterned layer;
  and, preferably, (d) exposing the remaining layer to activating radiation; and (e) heating the remaining, exposed layer to cure the oligomer or polymer and to remove residual carboxylic acid groups.

DETAILED DESCRIPTION OF THE INVENTION

The oligomers or polymers of this invention are characterized in that they are solution processible, curable, photosensitive, and developable using an alkaline aqueous base.

The oligomers or polymers are curable because they contain benzocylobutene groups that can be used to cross-link the polymer by subsequent heating. The presence of the photoswitchable group which forms a carboxylic acid group, upon exposure to radiation, makes the exposed, curable polymer or oligomer soluble in alkaline aqueous solutions. The fact that the carboxylic acid group can be effectively removed and the photosensitive group rendered substantially non-polar during the curing step for the polymer renders the cured polymer less subject to water uptake and retention than previously known aqueous developable BCB based polymers. Unlike prior art photosensitive benzocyclobutene based oligomers, no additional low molecular weight photosensitive agent is required.

There must be sufficient presence of the photoswitchable groups in the polymer or oligomer such that the polymer is rendered soluble in aqueous base after exposure to radiation. Preferably, the oligomer or polymer is characterized by equivalent weights in the range of at least 250, more preferably at least 300, most preferably at least 350 grams per mole of photoswitchable group, and preferably less than 800, more preferably less than 600, most preferably less than 550 grams per mole of photoswitchable group.

Preferably, the curable product has an apparent weight average molecular weight (Mw) as determined by Gas Permeation Chromatography (GPC) is at least about 1000 g/mol, more preferably at least about 1500 g/mol and is preferably less than about 50,000 g/mol, more preferably less than about 25,000 g/mol, and most preferably less than about 15,000 g/mol. If the molecular weight is too high, development in aqueous base may become difficult.

According to one embodiment, the oligomer comprises units of the formula I:

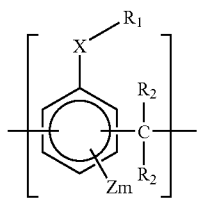

and units selected from the following formulas II:

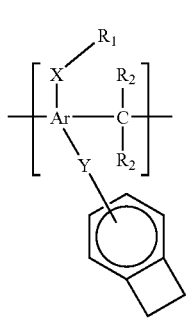 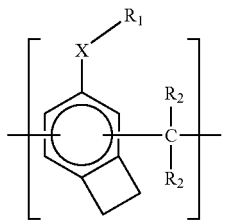

wherein X is independently in each occurrence a bond or a divalent linking group;

$R_1$ is a photosensitive moiety which forms a moiety having pendant carboxylic acid group when exposed to activating wavelengths of radiation and which subsequently converts to a substantially non-polar moiety when heated by emitting carbon dioxide;

$R_2$ is independently in each occurrence hydrogen, aliphatic hydrocarbyl, aryl aralkyl, or cycloaliphatic hydrocarbyl; preferably $R_2$ is hydrogen;

Y is a bond or a divalent linking group, preferably Y is —(Y'—Ar)$_p$—O— where Y' is oxygen sulfur or an inertly substituted or unsubstituted aliphatic hydrocarbyl group, p is 0, 1, or 2, and preferably 0;

Ar is independently in each occurrence a $C_6$ to $C_{10}$ aromatic moiety optionally substituted with up to two groups other than hydrogen selected independently in each occurrence from alkyl, aryl, aralkyl, alkaryl, alkanoyl, aroyl, alkoxy, or aryloxy; preferably Ar is a benzene ring;

Z is alkyl, aryl, or halogeno; and m is 0, 1, 2, or 3.

Oligomers or polymers of the above stated embodiment can be made by making the hydroxyl substituted oligomers or polymers by the method taught in U.S. Pat. No. 5,349,111, incorporated herein by reference. Specifically, one can make these polymers or oligomers by reacting a phenolic compound, an aldehyde or a ketone, and a hydroxylsubstituted benzocyclobutene compound wherein the hydroxyl is a substituent of an aromatic ring in the compound. After forming a hydroxylsubstituted polymer the polymer is coupled to the photoswitchable group $R_1$. To obtain the maximum possible benefit on reduction of moisture uptake in the polymer it is desirable that a substantial proportion, preferably a majority, most preferably substantially all, of the hydroxy groups are reacted or coupled to the photoswitchable group $R_1$.

Preferably, $R_1$ is a diazoquinone group, more preferably diazonapthaquinone, and most preferably 1,2,naphthaquinone-2-diazido (DNQ). DNQ converts to an indene carboxylic acid group upon exposure to radiation in the presence of water. The indene carboxylic acid converts to an indene group with a loss of carbon dioxide when the species is heated.

Preferably, X comprises hydrocarbylene groups (e.g. alkylene groups, arylene groups, arylalkylene groups, alkenylene, etc.) but more preferably are hydrocarbyl groups with additional heteroatom (e.g. O, S, N, Si, etc.) containing groups. Examples of such heteroatom containing groups includes —O($SO_2$)—; —NH—($SO_2$)—. Preferably the linking group is the residue from the reaction of a hydroxy substituted hydrocarbyl moiety with a halogen substituted diazoquinone, such as diazoquinone sulfonyl chloride.

According to an alternative embodiment the curable oligomers or polymers are characterized by the presence of one the following units or a combination of one or more of the following units:

Formula III:

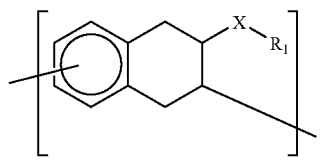

Formula IV:

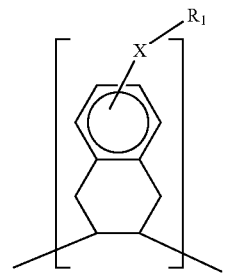

Formula V:

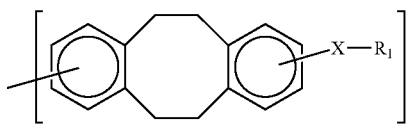

wherein X is independently in each occurrence a bond or a divalent linking group; and $R_1$ is a photosensitive moiety which forms a moiety having pendant carboxylic acid group when exposed to activating wavelengths of radiation and which subsequently converts to a substantially non-polar moiety when heated by emitting carbon dioxide.

Preferably, $R_1$ is a diazoquinone group, more preferably diazonapthaquinone, and most preferably 1,2,naphthaquinone-2-diazido (DNQ). DNQ converts to an indene carboxylic acid group upon exposure to radiation in the presence of water. The indene carboxylic acid converts to an indene group with a loss of carbon dioxide when the species is heated.

Preferably, X comprises hydrocarbylene groups (e.g. alkylene groups, arylene groups, arylalkylene groups, alkenylene, etc.) but more preferably are hydrocarbyl groups with additional heteroatom (e.g. O, S, N, Si, etc.) containing groups. Examples of such heteroatom containing groups includes —O($SO_2$)—; —NH—($SO_2$)—. Preferably the linking group is the residue from the reaction of a hydroxy substituted hydrocarbyl moiety with a halogen substituted diazoquinone, such as diazoquinone sulfonyl chloride.

In addition to the units III–V set forth above which comprise the pendant photosensitive moiety $R_1$, the oligomer or polymer of this alternative embodiment may comprise additional units and species which are the reaction product of the original benzocyclobutene monomers and are the residual groups from such reactions. Non-limiting examples of such repeat units include:

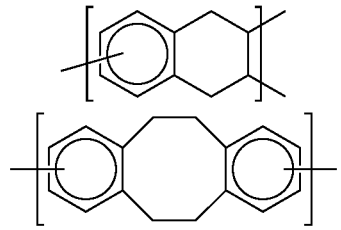

In this alternative embodiment, the oligomer or polymer also contains unreacted, reactive groups pendant to or embedded within the polymer or oligomer backbone. The presence of these unreacted groups enables later cure and cross-linking of the material. Examples of such reactive groups include benzocyclobutene groups and vinyl groups. The oligomer or polymer may also contain additional, substantially non-reactive moieties that are residual groups from the starting monomers. Non-limiting examples of such substantially non-reactive moieties include alkyl groups, alkylene groups, aryl groups, arylene groups, siloxane groups and the like.

The oligomers or polymers of this alternative embodiment may be made by reacting a first benzocyclobutene monomer with a second benzocyclobutene monomer having a hydroxy containing substituent. At least one of the first or second monomer types has at least two reactive groups (not including the hydroxy group) such that a branching structure is obtained and subsequent crosslinking is feasible. The reactive groups are preferably benzocyclobutene group or a vinyl group.

The first benzocyclobutene monomer may be of the formula:

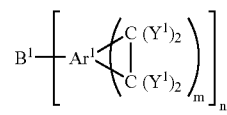

wherein $B^1$ is an n-valent organic linking group, preferably comprising ethylenic unsaturation, or $B^1$ is absent. Suitable single valent $B^1$ groups preferably have the formula —$CR^8$=$CR^9Z$, wherein $R^8$ and $R^9$ are independently selected from hydrogen, alkyl groups of 1 to 6, most preferably 1 to 3 carbon atoms, and aryl groups, and Z is selected from hydrogen, alkyl groups of 1 to 6 carbon atoms, aryl groups, —$CO_2R^7$ wherein $R^7$ is an alkyl group, preferably of up to 6 carbon atoms, an aryl group, an aralkyl group, or an alkaryl group. Most preferably Z is —$CO_2R^7$ wherein $R^7$ is an alkyl group, preferably of up to 6 carbon atoms, an aryl group, an aralkyl group, or an alkaryl group. Suitable divalent $B^1$ groups include —($CR^8$=$CR^9$)$_o$—(Z')$_{o-1}$, wherein $R^8$ and $R^9$ are as defined previously, o is 1 or 2, and Z' is an alkyl group of 1 to 6 carbon atoms, an aromatic group, or a siloxane group. Most preferably o is 2 and Z' is a siloxane group.

$Ar^1$ is a polyvalent aromatic or heteroaromatic group and the carbon atoms of the cyclobutane ring are bonded to adjacent carbon atoms on the same aromatic ring of $Ar^1$, preferably $Ar^1$ is a single aromatic ring;

m is an integer of 1 or more, preferably 1;

n is an integer of 1 or more, preferably 2–4, more preferably 2; and $Y^1$ is a monovalent group, preferably hydrogen, lower alkyl of up to 6 carbon atoms. In order to obtain a cross-linkable system, this monomer should have at least three reactive groups. The reactive groups in this monomer are the arylcyclobutarene function itself and/or the vinyl groups.

The synthesis and properties of these cyclobutarenes, as well as terms used to describe them may be found, for example, in U.S. Pat. Nos. 4,540,763; 4,724,260; 4,783,514; 4,812,588; 4,826,997; 4,999,499; 5,136,069; 5,185,391; 5,243,068 all of which are incorporated herein by reference.

According to one particularly preferred embodiment, the monomer (a) has the formula:

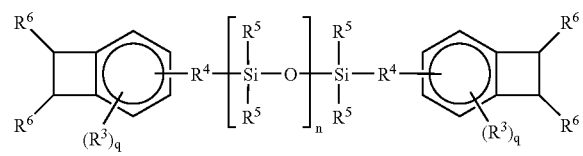

wherein each $R^3$ is independently an alkyl group of 1–6 carbon atoms, trimethylsilyl, methoxy or chloro; preferably $R^3$ is hydrogen;

each $R^4$ is independently a divalent, ethylenically unsaturated organic group, preferably an alkenyl of 1 to 6 carbons, most preferably —CH$_2$=CH$_2$—;

each $R^5$ is independently hydrogen, an alkyl group of 1 to 6 carbon atoms, cycloalkyl, aralkyl or phenyl; preferably $R^5$ is methyl;

each $R^6$ is independently hydrogen, alkyl of 1 to 6 carbon atoms, chloro or cyano, preferably hydrogen;

n is an integer of 1 or more; and each q is an integer of 0 to 3.

The preferred organosiloxane bridged bisbenzocyclobutene monomers can be prepared by methods disclosed for example in U.S. Pat. Nos. 4,812,588; 5,136,069; 5,138,081 and WO 94/25903. Most preferably, the first monomer is DVS-bisBCB.

The second benzocyclobutene monomer is a hydroxy functional benzocycloutene monomer and may have the formula:

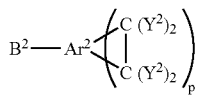

wherein $B^2$ is a monovalent organic group with hydroxy functionality, preferably also containing ethylenic unsaturation;

$Ar^2$ is a polyvalent aromatic or heteroaromatic group and the carbon atoms of the cyclobutane ring are bonded to adjacent carbon atoms on the same aromatic ring of $Ar^2$ preferably $Ar^2$ is a single aromatic ring;

p is an integer of 1 or more, preferably 1;

$Y^2$ is a monovalent group, preferably hydrogen, lower alkyl of up to 6 carbon atoms.

Non-limiting examples of the second monomer include:

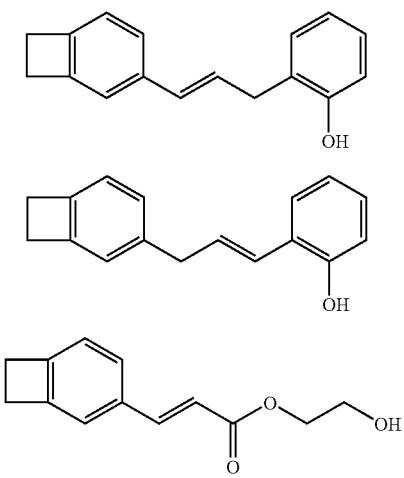

The first and second monomers are reacted preferably in solvent but optionally neat, to form an oligomer or prepolymer that may then be used in aqueous base developed imaging systems such as wet etch and photosensitive systems. Polymerization preferably occurs at a temperature in the range of about 125 to about 300° C., more preferably about 130 to about 200° C. The polymerization may occur for a time determined to provide a partially polymerized resin that provides the desired finally cured film properties. The molar ratio of first monomer to the second monomer is preferably from more than about 10:90, more preferably more than about 20:80. The molar ratio of first monomer to second monomer is preferably less than about 70:30, more preferably less than 50:50, more preferably still less than 40:60. Suitable solvents include those that dissolve the reacting monomers at the relevant processing temperature. Preferably, the solvent also dissolves the partially polymerized resin. Examples of such solvents include aromatic hydrocarbons such as toluene, xylene and mesitylene; $C_3$–$C_6$ alcohols; methylcyclohexanone; N-methylpyrrolidinone; butyrolactone; dipropylene glycol dimethyl ether isomers (commercially available from The Dow Chemical Company as Proglyde™ DMM). Dowanol™ DPMA ((di(propylene glycol) methyl ether acetate isomers available from The Dow Chemical Company) is preferred.

After initial polymerization a compound is added which comprises the $R_1$ functionality and a moiety which will react with the hydroxyl or amino groups to couple $R_1$ to the oligomer. Preferably, this compound is halogenated diazonaphthaquinone. Most preferably this compound is diazonaphthaquinone sulfonyl chloride. For example, the oligomer and the diazonaphthaquinone sulfonyl chloride may be dissolved in a suitable solvent such as acetone. A small amount of a mixture of triethylamine and acetone can be added and the reaction should occur around room temperature. The reaction product is isolated by quenching with dilute acid solution such as dilute hydrochloric acid. To obtain the maximum possible benefit on reduction of moisture uptake in the polymer is desirable that a substantial proportion, preferably a majority, most preferably substantially all, of the hydroxy groups are reacted or coupled to the photoswitchable group $R_1$.

These oligomers and polymers of this invention are contemplated for use in manufacture of electronic devices. In such use the oligomers or polymers are applied to a substrate. The substrate may be any substrate known to be useful in the microelectronics industry, such as, for example, silicon, glass, copper, aluminum ceramic, FR4 (glass reinforced epoxy), polyimide, bistriazine, and silicon nitride. A variety of application methods are also contemplated including: spin-coating, curtain-coating, roller-coating, spray-coating, dip-coating, extrusion coating, meniscus coating. If a solvent coating method is used, the solvent is advantageously removed by evaporation, preferably by a light heating step for example on a hot plate to accelerate drying. The thickness of the film so applied will vary with the intended usage, but thicknesses of 0.5 to 50 µm are generally contemplated.

Additional additives such as adhesion promoters, fillers, anti-oxidants, additional photoactive agents, inhibitors or solubilizers may be used as desired.

To form a patterned film, the film is imagewise exposed to activating wavelengths of radiation. Wavelengths of 250 to 500 nm have been found to be suitable. It is preferable to expose the film to the radiation in the presence of water. The water may be applied by any known method, such as spraying onto the film or, less desirably, the exposure may occur in an environment having a humidity of greater than 60 percent. Hydrophilic solvents such as, N-methylpyrrolidinone, acetone, ethyl lactate, and Dowanol PMA (Dow Chemical™) may be used in stead of water if convenient. The use of hydrophilic solvents allows normal clean room temperatures and humidities to be used with this resin. In fact, if the oligomer is coated from a hydrophilic solvent, no additional water or solvent needs to be added to the coating provided the solvent is not entirely removed from the coating prior to exposure. Exposure may occur for example by exposure through a mask layer or material or by direct address with a laser in an imagewise manner.

After exposure is complete, the image is developed by removing the exposed regions by washing with an aqueous alkaline solution. Preferably, the pH of the solution is greater than 10, more preferably greater than 12. Examples of such solutions include sodium hydroxide, potassium hydroxide, or tetramethylammonium hydroxide (TMAH) solutions.

After the development step, the remaining film is exposed to the activating radiation. This converts the diazoquinone to a carboxylic acid containing group. The conditions useful in this exposure step are substantially the same as for the initial exposure step except that imagewise exposure is not required. In fact, a flood exposure to the activating radiation is preferred.

The film is then cured by heating. Preferred cure temperatures are in the range of 190 to 300° C., more preferably 200–250° C. Time for cure depends upon cure temperature selected. However, cure times between 30 minutes and 5 hours have been found to be suitable. The carboxylic acid is then removed during this heating step. Therefore, the resulting cured, imaged film is relatively resistant to water uptake from the environment during subsequent use of the device.

Additional process steps, (e.g. metallization, etc.) may be performed to construct an operational microelectronic device.

EXAMPLES

Example 1

Synthesis of Compounds 1a and 1b.

In a 3-L three neck round bottom flask equipped with a mechanical stirring mechanism, a reflux condenser, and a nitrogen inlet adapter was added brominated benzocyclobutene monomer (see e.g., U.S. Pat. No. 4,822,930 for a method of synthesis of this monomer, 350 g, 1.91 mol), 2-allylphenol (256 g, mmol), tri-o-tolylphosphine (10 g, mmol), palladium(II) acetate (2.28 g, mmol), potassium acetate (144 g of solid, 402 g of a 60 wt % solution in water, total mol=3.93), water (131 mL) and DMF (585 mL). The contents were purged with nitrogen for 30 minutes and then heated overnight at 93° C. Upon cooling to room temperature, water (1 L) and toluene (800 mL) were added. The organic layer was separated, washed with water (4×1 L), and dried over $MgSO_4$. The crude material was distilled twice using a short path distillation apparatus (150° C., 3 mtorr) to give a pale oil (220 g, 0.93 mol, 49%). Characterization showed it was a mixture of 1-(bicyclo[4.2.0]octa 1,3,5-trien-3-yl)-3-(2-hydroxyphenyl)-propene and 1-(2-hydroxyphenyl)-3-(bicyclo[4.2.0]octa 1,3,5-trien-3-yl)-propene. Yield was 220 g (0.93 mol, 49%).

Example 2

Synthesis of Compound 2.

In a 3-L three neck round bottom flask equipped with a mechanical stirring mechanism, a reflux condenser, and a nitrogen inlet adapter was added brominated benzocyclobutene (350 g, 1.91 mol), 2-hydroxyethyl acrylate (226 g, 1.95 mol), tri-o-tolylphosphine (12.45 g, mmol), palladium (II) acetate (2.29 g, mmol), potassium acetate (385 g, mol), water (292 mL) and DMF (585 mL). The contents were purged with nitrogen for 40 min and then heated overnight at 95° C. Upon cooling to room temperature, water (1 L) and toluene (800 mL) were added. The organic layer was separated, washed with water (4×1 L), and dried over $MgSO_4$. The crude material was distilled twice using a short path distillation apparatus (151° C., 4 mtorr) to give a pale oil (330 g, 1.51 mol, 79%). Characterization showed it was 2-hydroxyethyl 1-(bicyclo[4.2.0]octa 1,3,5-trien-3-yl)-acrylate.

Example 3

B-Staging a 75 to 25 Mole Mixture of Compound 1 and DVS-bisBCB.

Compound 1 as made in example 1 (45.07 g, 0.19 mol) and DVS-bisBCB (24.6 g, 0.063 mol) were placed in a 500 mL three necked flask equipped with a mechanical stirrer, a nitrogen inlet, and a condenser. The mixture was stirred and heated under nitrogen with an oil bath at 170° C. for 25.5 hours. GPC showed Mw of 989 g/mol.

Example 4

Coupling Reaction of BCB Oligomer with Pendant Phenols from Example 3 with DNQ Sulfonyl Chloride.

A 1-L three neck round bottom flask equipped with a magnetic stir bar, a reflux condenser, and a nitrogen inlet adapter was charged with the BCB oligomer with pendant phenols from Example 3 (49.1 g, 134 mmol of phenoxy functionality), 2-diazo-1,2-naphthoquinone-5-sulfonyl chloride [DNQ-sulfonyl chloride] (36.7 g, 137 mmol), and acetone (300 mL). The contents were cooled to 15° C. in an ice/water bath and a solution of triethyl amine (14.5 g, 143 mmol) in acetone (50 mL) was added dropwise over 10 minutes. The ice/water bath was removed and stirring was continued while protecting from light for 20 hours. The reaction mixture was poured into a flask containing 1% aqueous HCl (1200 mL). The polymer precipitated into a sticky mass. The polymer mass was dissolved using dichloromethane (500 mL). The layers were separated and the dichloromethane layer containing the desired polymer was washed with 1% aqueous HCl (300 mL). The organic solution was dried over sodium sulfate and filtered. The solvent was removed under vacuum on the rotary evaporator to give the crude product slightly wet with solvent (58 g). The product was dried by placing in hood with a nitrogen stream to drive out remaining solvent.

Example 5

Lithography of BCB-phenoxy-DNQ.

The oligomer from Example 4 (3 g) was dissolved in 6.1 g of cyclohexanone. AP3000 adhesion promoter from The Dow Chemical Company was spin-coated on a 4 inch test wafer of Si at 500 rpm for 5 seconds and 2000 rpm for 30 seconds. The BCB-phenoxy-DNQ solution was spin-coated on top of the adhesion promoter at 500 rpm for 10 seconds followed by spinning at 2000 rpm for 30 seconds. The wafer was baked on a hot plate at 75° C. for 40 seconds. The wafer with a fine mist of water sprayed on top was exposed with a Karl Suss exposure tool at a wavelength of 365 nm through a mask. The gap between the mask and the film was 30 μm. Exposure dose was 300 mJ/cm². The exposed wafer was immersed in a 2.4% TMAH bath for 2 minutes. Vias of 20 μm were open. The patterned wafer was flood exposed with a fine mist of water sprayed on top for 300 mL/cm² followed by curing in a nitrogen purged oven at 250° C. for 1 hour.

Example 6

Monitoring Change of Functional Group by IR Spectroscopy.

A BCB-phenoxy-DNQ in cyclohexanone solution similar to the one described in Example 5 was spin-coated on a FTIR wafer followed by baking at 75° C. for 40 seconds. The wafer with a fine mist of water sprayed on top was exposed to 365 nm wavelength radiation through a quartz mask. IR spectroscopy showed conversion of DNQ (disappearance of peaks from 2160 $cm^{-1}$ to 2120 $cm^{-1}$) to carboxylic acid (appearance of broad absorption around 3000 $cm^{-1}$ and strong peak at 1680 $cm^{-1}$). The wafer was cured in a nitrogen purged oven at 250° C. for 1 hour. IR spectrum of the wafer showed removal of carboxylic acid (disappearance of peak at 1680 $cm^{-1}$).

Example 7

B-Staging a 90 to 10 Mole Mixture of Compound 1 and DVS-bisBCB.

Compound 1 (45 g, 0.19 mol) and DVS-bisBCB (7.37 g, 0.0019 mol) were placed in a 500 mL three necked flask equipped with a mechanical stirrer, a nitrogen inlet and a condenser. The mixture was stirred and heated under nitrogen with an oil bath at 170° C. for 24 hour. GPC showed Mw of 2910 g/mol.

Example 8

Coupling Reaction of Product from Example 7 with DNQ Sulfonyl Chloride.

A 1-L three neck round bottom flask equipped with a magnetic stir bar, a reflux condenser, and a nitrogen inlet adapter was charged with the product from Example 7 (39.32 g, 143 mmol of phenoxy functionality), DNQ sulfonyl chloride (39.2 g, 146 mmol), and acetone (325 mL). Triethyl amine (15.4 g, 152 mmol) was added dropwise over 10 minutes. Stirring was continued while protecting from light for 20 hours. The reaction mixture was poured into a flask containing 1N HCl (300 mL) and dichloromethane (500 mL). The layers were separated and the aqueous layer was extracted with additional dichloromethane (100 mL). The combined dichloromethane layers were washed with 1N aqueous HCl (100 mL). The organic solution was dried over sodium sulfate and filtered. The solvent was removed under vacuum on the rotary evaporator to give the crude product slightly wet with solvent (75 g). The product was dried by placing in hood with a nitrogen stream to drive out remaining solvent.

Example 9

B-Staging a 75 to 25 Mole Mixture of Compound 2 and DVS-bisBCB.

Compound 2 (25.4 g, 0.117 mol) and DVS-bisBCB (15.2 g, 0.039 mole) were placed in a 500 mL three necked flask equipped with a mechanical stirrer, a nitrogen inlet, and a condenser. The mixture was stirred and heated under nitrogen with an oil bath at 170° C. for 19 hour. GPC showed Mw of 848 g/mol.

Example 10

Coupling Reaction of Compound 2 with DNQ Sulfonyl Chloride.

In a 250-mL amber jar compound 2 was added (3.20 g, 14.7 mmol), DNQ sulfonyl chloride (4.01 g, 14.9 mmol) and acetone (80 mL). To this stirring solution was added triethylamine (2.50 g, 24.7 mmol in 5 g of acetone) over a period of 2 minutes. The reaction mixture was stirred overnight in the dark at room temperature, during which time a significant amount of solid formed. After this time, the mixture was slowly poured into a 1-L beaker containing 1% HCl in water (250 mL). The water was stirred during the addition. The resulting yellow solid was filtered, washed with water (6×25 mL), and dried under vacuum. IR showed the strong absorption at 2160 $cm^{-1}$ and 2120 $cm^{-1}$ due to the DNQ group and strong absorption at 1355 $cm^{-1}$, 1175 $cm^{-1}$ and 1000–770 $cm^{-1}$ due to the sulfonate group. Proton NMR spectrum of the compound was consistent with the conversion of the hydroxyl group to DNQ sulfonate.

Example 11

Coupling Reaction of the Product from Example 9 with DNQ Sulfonyl Chloride.

The product from Example 9 (12.0 g, 34.5 mmol of hydroxyl group), DNQ sulfonyl chloride (12.0 g, 44.7 mmol), triethylamine (7.20 g, 71 mmol) and 225 g of acetone were placed in a 500 mL amber vial with screw cap. The mixture was stirred overnight at room temperature. A large amount of solid was formed. The mixture was poured into 400 mL of 1% HCl. A sticky red solid was formed. The top layer was decanted, and the solid was washed several times with ice water. The solid was dissolved in acetone, transferred to a round bottom flask and acetone was removed by a rotary evaporator to dryness. Yield of product was 17.84 g.

Example 12

Patterned Film from Oligomer Prepared in Example 11.

Adhesion promoter AP3000 from The Dow Chemical Company was spin-coated on a 4 inch test wafer of Si at 500 rpm for 5 seconds and 2000 rpm for 30 seconds. An oligomer solution as in Example 11 (40 wt % in cyclohexanone) was spin coated on top of the adhesion promoter at 500 rpm for 5 seconds and 2000 rpm for 30 seconds. The wafer was baked at 75° C. for 45 seconds, allowed to cool to room temperature, sprayed with a fine mist of water, and exposed through a photomask (The gap between the wafer and the mask was 100 microns. Dose was 300 $mJ/cm^2$ as measured at 365 nm). The wafer was developed using 1.4% TMAH for 15 seconds. An image corresponding to the mask pattern was clearly visible under an optical microscope. The wafer was then flood exposed followed by cure for 1 hour at 250° C. A cross-section of the image showed height differentials of 1.6 μm.

Example 13

Patterned Film from Oligomer Prepared in Example 11.

A solution prepared from 3.01 g of oligomer in Example 12, 4.0 g of cyclohexanone and 1.0 g of 1-methyl-2-pyrrolidinone (NMP) was spin coated on a 4 inch Si wafer at 500 rpm for 5 seconds and 150 rpm for 30 seconds. The wafer was baked at 75° C. for 45 seconds, allowed to cool to room temperature and exposed through a photomask (The gap between the film and the mask was 100 microns. Exposure dose was 300 mJ/cm$^2$ as measured at 365 nm.). The wafer was developed using 1.4% TMAH for 15 seconds. A patterned film corresponding to the mask was formed.

Example 14

This oligomer from example 4 was dissolved in 0.71 g of 66.5% NMP and 33.5% acetone solution. This formulation was were spin coated on a MTI spin coater with temperature 26° C. and humidity control of 48%. The spin coating process consisted of a dynamic dispense of 50 rpm while 2 ml of the formulation was being dispensed into the middle of a 4 inch silicon wafer. The spin speed was increased to 500 rpm for 5 seconds to spread the material with a final film thickness spin time of 30 seconds. A 60 seconds dwell time in the constant temperature and humidity of the MTI track coater was used. Exposure of the DNQ coupled BCB films were on a Karl Suss mask aligner model MA150. The quartz mask that was used, was a Dow test mask, with via openings from 100 um to 3 um in size with both round and square openings. An exposure dose of 336 mJ/cm2 with a 10 um gap was used. The exposed wafer was immerged in a 2.4% TMAH bath for 1.5 minutes. Vias of 10 µm were open in a 0.75 um film.

What is claimed is:

1. A method of forming a patterned low dielectric constant film comprising:

forming a layer of a curable oligomer or polymer which oligomer or polymer comprises a backbone, benzocyclobutene reactive groups, and a photoswitchable pendant group which forms a carboxylic acid group upon exposure to radiation;

exposing the layer to activating radiation in an imagewise manner; and removing the exposed portions of the layer by washing with an alkaline aqueous solution to form a remaining patterned layer.

2. The method of claim 1 further comprising exposing the remaining layer to activating radiation; and heating the remaining, exposed layer to cure the oligomer or polymer and to remove residual carboxylic acid groups.

3. The method of claim 2 wherein the exposing steps occur in the presence of water or in a highly humid environment.

4. The method of claim 1 wherein the pendant group comprises diazonaphthoquinone.

5. The method of claim 2 wherein the radiation has a wavelength in the range of 250 to 500 nm.

6. The method of claim 2 wherein the heating step comprises heating to a temperature in the range of 190 to 300° C.

7. The method of claim 1 wherein the step of exposing in an imagewise manner comprises exposing to radiation through a mask.

8. The method of claim 1 wherein wherein the pendant groups are characterized by the presence of a moiety that forms a carboxylic acid group upon exposure to activating wavelengths of radiation said pendant group being further characterized in that after formation of the carboxylic acid group when the oligomer or polymer is cured by heating carbon dioxide is emitted and the group forms a substantially non-polar moiety.

* * * * *